(12) United States Patent
Zanchi et al.

(10) Patent No.: US 10,797,594 B1
(45) Date of Patent: Oct. 6, 2020

(54) SHARED COMPARATOR FOR CHARGE PUMPS

(71) Applicant: pSemi Corporation, San Diego, CA (US)

(72) Inventors: Brian Zanchi, Dracut, MA (US); Aichen Low, Cambridge, MA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/708,112

(22) Filed: Dec. 9, 2019

(51) Int. Cl.
| | | |
|---|---|---|
| *H02M 3/07* | (2006.01) | |
| *H03K 5/24* | (2006.01) | |
| *G01R 31/64* | (2020.01) | |
| *G01R 19/00* | (2006.01) | |
| *G01R 17/00* | (2006.01) | |

(52) U.S. Cl.
CPC ............ *H02M 3/073* (2013.01); *G01R 17/00* (2013.01); *G01R 19/0084* (2013.01); *G01R 31/64* (2020.01); *H03K 5/249* (2013.01)

(58) Field of Classification Search
CPC ....... H02M 3/073; G01R 31/64; G01R 17/00; G01R 19/0084; H03K 5/249
See application file for complete search history.

(56) References Cited

U.S. PATENT DOCUMENTS

| | | | |
|---|---|---|---|
| 7,573,415 B1 * | 8/2009 | Bailey | H03M 1/361 341/155 |
| 2005/0077934 A1 * | 4/2005 | Fahim | G06F 1/022 327/155 |

* cited by examiner

*Primary Examiner* — Dinh T Le
(74) *Attorney, Agent, or Firm* — Jaquez Land Greenhaus LLP; John Land, Esq.

(57) ABSTRACT

Power converter circuits, including DC-DC converter circuits, that conserve IC area by utilizing more area-efficient alternatives for measurement circuitry. Various embodiments include a power converter circuit including a charge pump having a plurality of stack-nodes $V_{CXM}$ and at least one multiplexor for coupling selected stack-nodes $V_{CXM}$ to a corresponding comparator circuit configured to output a signal indicative of a difference between a selected input to the multiplexor and a reference signal. The number of comparator circuits is less than $(N-1) \times M$, where N is the conversion gain of the power converter circuit (i.e., the number of charge pump stages X plus one), and M is the number of parallel charge pump legs. Related methods include measuring voltages at stack-nodes $V_{CXM}$ in a charge pump, wherein the stack-nodes $V_{CXM}$ are selected by means of a multiplexor and an input to a comparator.

16 Claims, 12 Drawing Sheets

SHARED COMPARATOR FOR CHARGE PUMPS

BACKGROUND

(1) Technical Field

This invention relates to electronic circuits, and more particularly to power converter circuits.

(2) Background

Many electronic products, particularly mobile computing and/or communication products and components (e.g., notebook computers, ultra-book computers, tablet devices, LCD and LED displays) require multiple DC voltage levels. For example, radio frequency transmitter power amplifiers may require relatively high voltages (e.g., 12V or more), whereas logic circuitry may require a low voltage level (e.g., 1-2V). Still other circuitry may require an intermediate voltage level (e.g., 5-10V).

Power converters are often used to generate a lower or higher DC voltage from a common power source, such as a battery. One type of power converter comprises a charge pump based on a switch-capacitor network, charge pump control circuitry, and, in some embodiments, auxiliary circuitry such as bias voltage generator(s), a clock generator, a voltage regulator, a voltage control circuit, etc. Power converters which generate a lower output voltage (e.g., $V_{OUT}$) level from a higher input voltage (e.g., $V_{IN}$) power source are commonly known as step-down or buck converters, so-called because $V_{OUT}<V_{IN}$, and hence the converter is "bucking" the input voltage. Power converters which generate a higher output voltage level from a lower input voltage power source are commonly known as step-up or boost converters, because $V_{OUT}>V_{IN}$. In many embodiments, a power converter may be bi-directional, being either a step-up or a step-down converter depending on how a power source is connected to the converter.

FIG. 1 is a block diagram of a prior art switched-capacitor power converter 100. In the illustrated example, the power converter 100 includes a generic charge pump 102 and a controller 104. The charge pump 102 is configured to receive an input voltage $V_{IN}$ from a voltage source 106 at terminals V1+, V1−, and transform the input voltage $V_{IN}$ into an output voltage $V_{OUT}$ at terminals V2+, V2−. The output voltage $V_{OUT}$ may be coupled across an output capacitor $C_{OUT}$, across which is connected a load 108. As used in this disclosure, the term "charge pump" refers to a switched-capacitor network configured to boost or buck $V_{IN}$ to $V_{OUT}$. Examples of the charge pump 102 include Dickson, Ladder, Series-Parallel, Fibonacci, and Doubler switched-capacitor networks, all of which may be configured as a multi-phase or a single-phase network.

The controller 104 receives a set of input signals and produces a set of output signals. Some of these input signals arrive along an input-signal path 110. These input signals carry information that is indicative of the operational state of the charge pump 102. The controller 104 also receives at least a clock signal CLK and one or more external input/output signals I/O that may be analog, digital, or a combination of both. Based upon the received input signals, the controller 104 produces a set of control-signals 112 that control the internal components of the charge pump 102 (e.g., internal switches, such as low voltage FETs, especially MOSFETs) to cause the charge pump 102 to boost or buck $V_{IN}$ to $V_{OUT}$. In some embodiments, an auxiliary circuit (not shown) may provide various signals to the controller 104 (and optionally directly to the charge pump 102), such as the clock signal CLK, the input/output signals I/O, as well as various voltages, such as a general supply voltage $V_{DD}$ and a transistor bias voltage $V_{BIAS}$.

FIG. 2 is a schematic diagram of one embodiment of a charge pump 200 that may be used as an instance of the generic charge pump 102 of FIG. 1. The illustrated charge pump 200 is a single-phase symmetric cascade multiplier configured to receive an input voltage (e.g., $V_{IN}$, which is 25V in this example) at terminals V1+, V1−, and transform the input voltage into a lower output voltage (e.g., $V_{OUT}$, which is 5V in this example) at terminals V2+, V2−. A cascade multiplier is a switched-capacitor network that can provide a high conversion gain. As used in this disclosure, conversion gain represents (1) a voltage gain if the switched-capacitor network produces an output voltage that is larger than the input voltage ($V_{OUT}>V_{IN}$), or (2) a current gain if the switched-capacitor network produces an output voltage that is smaller than the input voltage ($V_{IN}>V_{OUT}$). Energy is transferred from the input to the output by cycling the cascade multiplier through different topological states. Charge is transferred from the input voltage to the output voltage via a charge transfer path. The number and configuration of the capacitors in each topological state sets the conversion gain. The illustrated charge pump 200 would be controlled by the controller 104 of FIG. 1 in known fashion.

In the illustrated example, the charge pump 200 includes five series-connected switches S1-S5. The switches may be, for example, MOSFET switches—particularly N-type MOSFET switches—and each switch S1-S5 may comprise a stack of series-connected MOSFETs configured to function as a single switch. For convenience in discussing switching sequences, switches S1, S3, and S5 will sometimes be referred to collectively as the "odd switches" and switches S2 and S4 will sometimes be referred to collectively as the "even switches".

The charge pump 200 also includes first and second "low-side" phase switches S7, S8 and first and second "high-side" phase switches S6, S9. The low-side phase switches S7, S8 can connect first and second phase-nodes PN1, PN2 to the V2− terminal. The V1− terminal is typically connected to and thus shares the same voltage as the V2− terminal; however, in some embodiments the V1− and V2− terminals may not be directly connected and thus may have different voltages.

The high-side phase-switches S6, S9 can connect the first and second phase-nodes PN1, PN2 to the V2+ terminal. For convenience in discussing switching sequences, the high-side phase-switch S6 and the low-side phase-switch S8 will sometimes be referred to collectively as the "even phase-switches" and the low-side phase-switch S7 and the high-side phase-switch S9 will sometimes be referred collectively to as the "odd phase-switches."

The illustrated MOSFET embodiment assumes that the body and source terminals of each MOSFET transistor are connected together, in order to minimize ON resistance $R_{ON}$ and die area while maximizing power efficiency. When fabricated using a conventional silicon process technology, each MOSFET transistor has an inherent body-diode across its source and drain terminals (not shown). Because of the presence and polarity of the inherent body-diodes, a forward electrical path exists from terminal V2+ to terminal V1+ even when all of the switches S1-S5 have been opened.

A clock source in the controller 104 generates non-overlapping clock waveforms P1 and P2 that are coupled to and control the ON/OFF state of the various switches S1-S9, generally through level shifter and gate driver circuitry (not shown). In many embodiments, the illustrated charge pump 200 would be paired with a near-identical circuit, differing only in that the component switches would be operated on a different (generally 180° opposite) phase.

A first pump capacitor C1 connects a first stack-node $V_{C1}$ between switches S1 and S2 to phase-node PN1. Similarly, a third pump capacitor C3 connects a third stack-node $V_{C3}$ between switches S3 and S4 to phase-node PN1. A second pump capacitor C2 connects a second stack-node $V_{C2}$ between switches S2 and S3 to phase-node PN2. Similarly, a fourth pump capacitor C4 connects a fourth stack-node $V_{C4}$ between switches S4 and S5 to phase-node PN2. Typically, the voltage at each stack-node $V_{CX}$ (where "X" equals the number of charge pump stages, which is four in this example) and across terminals V1+, V1– and V2+, V2– could be monitored by a dedicated measurement circuit similar to the comparator circuit shown in FIG. 3, discussed below (typically included as part of the controller 104). A fifth stack-node, $V_X$, connects to terminal V2+ of the charge pump 200 (the final output of the power converter is $V_{OUT}$).

The illustrated charge pump 200 has four stages. The first stage includes switch S1, first stack-node $V_{C1}$, and first pump capacitor C1; the second stage includes switch S2, second stack-node $V_{C2}$, and second pump capacitor C2; the third stage includes switch S3, third stack-node $V_{C3}$, and third pump capacitor C3; and the fourth stage includes switch S4, fourth stack-node $V_{C4}$, and fourth pump capacitor C4. A fifth series switch S5 connects the fourth stage to the fifth stack-node, $V_X$, which connects to terminal V2+.

In response to receiving one or more input signals along an input-signal path 110, the controller 104 outputs a set of control-signals 112 to the charge pump 200 (see also FIG. 1). These control signals cause the series switches S1-S5, the low-side phase-switches S7, S8, and the high-side phase-switches S6, S9 to change states according to a specific sequence. As a result, the charge pump 200 repeatedly transitions between first and second operating states at a selected frequency.

For example, during a first operating state defined by the P1 clock waveform having a logic "1" state and the P2 clock waveform having a logic "0" state, the controller 104 (1) closes the odd switches S1, S3, S5, the low-side phase switch S7, the high-side phase switch S9, and (2) opens the even switches S2, S4, the high-side phase switch S6, and the low-side phase switch S8. During a second operating state defined by the P2 clock waveform having a logic "1" state and the P1 clock waveform having a logic "0" state, the controller 104 (1) opens the odd switches S1, S3, S5, the low-side phase switch S7, and the high-side phase switch S9, and (2) closes the even switches S2, S4, the high-side phase switch S6, and the low-side phase switch S8. The controller 104 controls and sequences transitions of all the switches S1-S9 in such a way as to incorporate any necessary dead-time needed when transitioning between the first and second operating states. As a consequence of alternating between the first operating state and the second operating state, charge is conveyed from terminals V1+, V1– to terminals V2+, V2–, in known fashion.

The maximum conversion gain ratio (in this case, a current-transformation ratio) for the illustrated embodiment is five because there are four stages. This means the input voltage received by charge pump 200 across terminals V1+, V1– is five times higher than the output voltage produced across terminals V2+, V2–. Thus, for example, if 25V is applied across terminals V1+, V1–, the voltage across the capacitors C1-C4 will progressively decrease to 20V, 15V, 10V, and 5V, respectively, such that the voltage across terminals V2+, V2– will be 5V.

As noted above, in conventional designs, each stack-node $V_{CX}$ generally could be monitored by a dedicated measurement circuit to provide feedback to the controller 104. For example, monitoring the voltage at the stack-nodes $V_{CX}$ (in addition to $V_{IN}$ and $V_X$) can be necessary for various reasons, such as charge pump startup, rebalancing, detection of non-critical faults, etc. Monitoring is typically performed using a measurement circuit such as a comparator circuit. For example, FIG. 3 is a schematic diagram of a prior art embodiment of a voltage measurement circuit 300. A stack-node $V_{CX}$ is coupled to a voltage divider comprising series-connected resistors R1, R2, which provides a scaled voltage to a first input of a comparator 302. A second input of the comparator 302 is coupled to a reference voltage, which may have different values for each stack-node $V_{CX}$. The comparator 302 outputs a comparison value, Vmon, which represents the difference between the input voltages, and which typically would be coupled to other circuitry in the controller 104.

The trend in the electronics industry, particularly with respect to low-power handheld RF transceiver-based products such as cell phones and the like, is for integrated circuit (IC) dimensions to continue to decrease and for the amount of circuitry per IC to continue to increase. Thus, the IC area or "real estate" occupied by circuitry becomes an even more valuable resource to be optimized. Conventional charge pump circuits that dedicate a measurement circuit per stack-node $V_{CX}$, particularly when multiple phase and/or higher conversion gain charge pumps are used, consume vital IC area. The number of stack-nodes $V_{CX}$ to monitor is a function of the conversion gain ratio N and the number of phases M: number of measurement circuits [e.g., comparators]=(N–1)×M. For example, for a dual-phase charge pump having a conversion gain ratio of five implemented with the circuitry shown in FIG. 2, there are eight stack-nodes $V_{CX}$, resulting in eight measurement circuits in conventional designs.

Accordingly, there is a need for power converter circuits, including DC-DC converter circuits, that conserve IC area by utilizing more area-efficient alternatives for measurement circuitry. The present invention meets this and other needs.

SUMMARY

The present invention encompasses power converter circuits, including DC-DC converter circuits, that conserve IC area by utilizing more area-efficient alternatives for measurement circuitry.

Various embodiments include a power converter circuit including at least one set of N series switches where N≥2, each set configured as one of M charge pump legs where M≥1, wherein each pair of adjacent series switches in each charge pump leg defines a stack-node $V_{CXM}$ located between the adjacent series switches where N–1≥X>1; at least one voltage scaling circuit, each coupled to a corresponding stack-node $V_{CXM}$ and configured to output a voltage proportional to a voltage at the corresponding stack-node $V_{CXM}$; at least one multiplexor, each having (1) at least one input, each input coupled to the output of a corresponding one of the at least one voltage scaling circuit, and (2) at least one output; and at least one comparator circuit, each having a first input coupled to a corresponding output of one of the at least one multiplexor, and a second input coupled to a reference signal, and configured to output a signal indicative of a difference between a selected input to the multiplexor and the reference signal; wherein the number of comparator circuits is less than (N−1)×M.

Related methods include measuring voltages at stack-nodes $V_{CXM}$ in a charge pump, wherein the stack-nodes $V_{CXM}$ are selected by means of a multiplexor and an input to a comparator, and testing pump capacitors in a charge pump by measuring voltages at stack-nodes $V_{CXM}$ in the charge pump, wherein the stack-nodes $V_{CXM}$ are selected by means of a multiplexor and an input to a comparator.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses power converter circuits, including DC-DC converter circuits, that conserve IC area by utilizing more area-efficient alternatives for measurement circuitry.

For ease of understanding, the following embodiments include a step-down DC-DC charge pump as an example of an instance of a charge pump. However, as one of ordinary skill in the art would understand, the disclosed inventions encompass similar embodiments using step-up charge pumps, as well as AC-DC power converters.

First Embodiment

Figure 1:
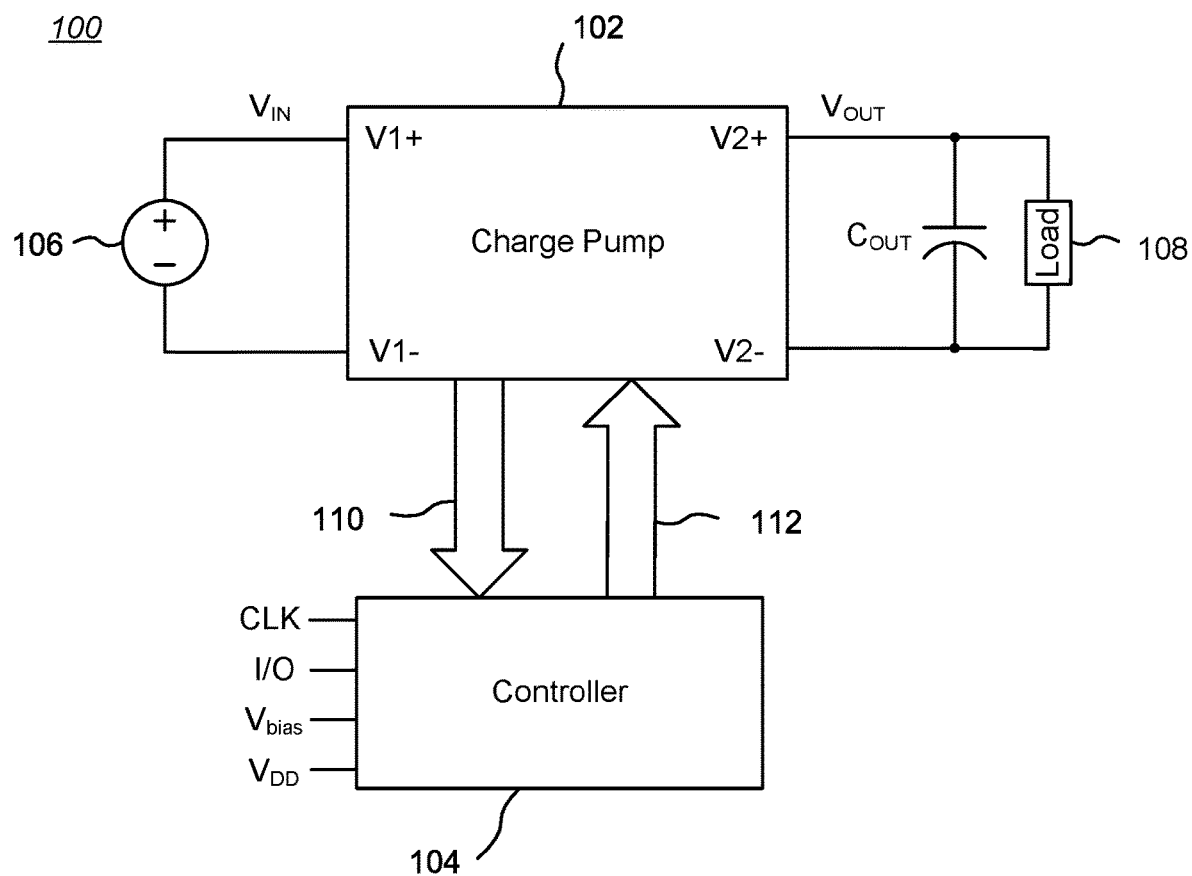
FIG. 1 is a block diagram of a prior art switched-capacitor power converter.
Figure 2:
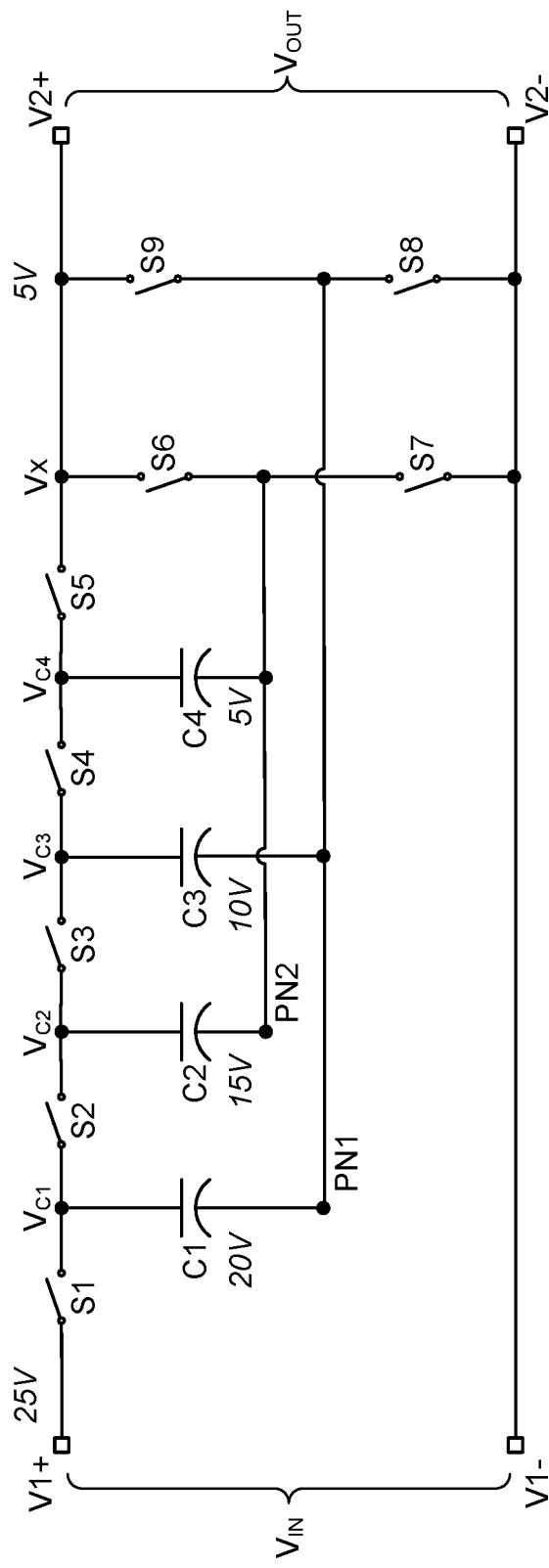
FIG. 2 is a schematic diagram of one embodiment of a single-phase charge pump that may be used as an instance of the generic charge pump of FIG. 1.
Figure 3:
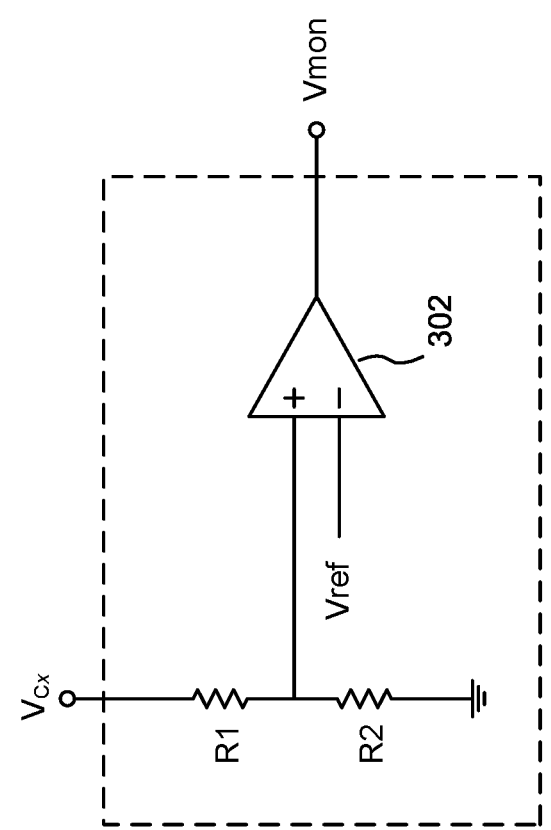
FIG. 3 is a schematic diagram of a prior art embodiment of a voltage measurement circuit.
Figure 4A:
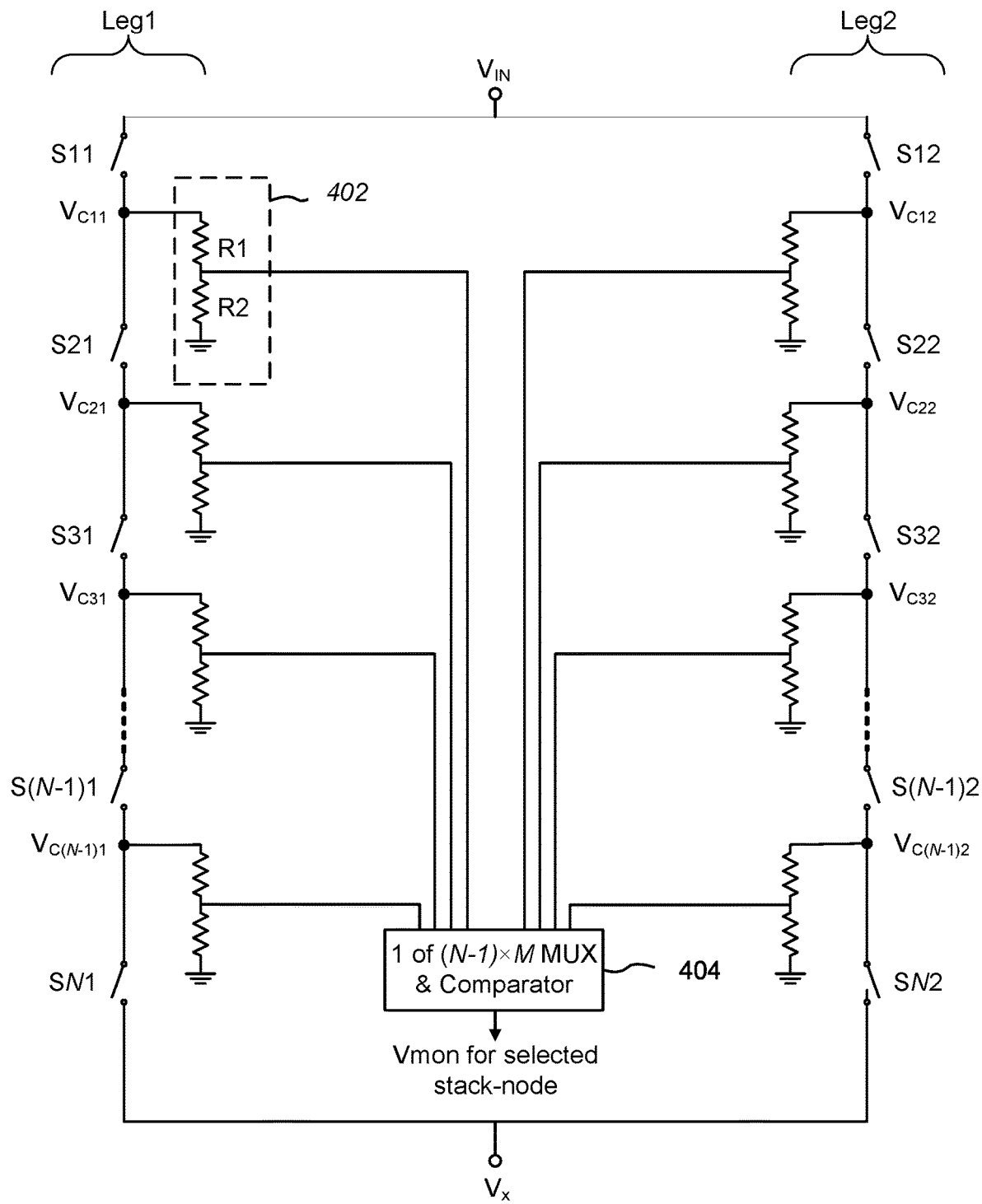
FIG. 4A is a schematic diagram of a multi-phase charge pump having a first measurement circuit architecture.

FIG. 4A is a schematic diagram of a multi-phase charge pump 400 having a first measurement circuit architecture. In the illustrated embodiment, the charge pump 400 includes 2 parallel sets or "legs" of series switches Leg1, Leg2. Each leg Leg1, Leg2 is similar to the single-phase charge pump 200 shown in FIG. 2 (capacitors and phase switches have been omitted to avoid clutter). As is known in the art, switching of the charge pump legs Leg1, Leg2 generally could be controlled to be on different (typically opposite) clock cycles, the number of legs that may be present in a multi-phase charge pump may be M where M≥1, and the charge pump 400 may be readily reconfigured to operate in a step-up mode.

In greater detail, Leg1 of the illustrated embodiment includes series-connected switches S11 to SN1, where N is the conversion gain of the circuit (i.e., the number of charge pump stages plus one) and N≥2. Similarly, Leg2 of the illustrated embodiment includes series-connected switches S12 to SN2. Stack-nodes $V_{CXM}$ are located between adjacent switches of each leg. In the illustrated example, Leg1 includes stack-nodes $V_{C11}$ to $V_{C(N-1)1}$, and Leg2 includes stack-nodes $V_{C12}$ to $V_{C(N-1)2}$. As a shorter notation, the stack-nodes of a charge pump leg M may be designated as $V_{CXM}$, where N−1≥X>1 (thus, the maximum value of "X" equals the number of charge pump stages).

In the illustrated embodiment, the stack-nodes $V_{CXM}$ each have a corresponding voltage scaling circuit 402, which is illustrated in this example as a voltage divider including series-connected resistors R1, R2 coupled between the corresponding stack-node $V_{CXM}$ and circuit ground (not all voltage scaling circuits or resistors are labeled to avoid clutter). The output voltage at the midpoint of the series-connected resistors R1, R2 is a scaled value that is a function of the voltage from the corresponding stack-node $V_{CXM}$ and the ratio R2 to (R1+R2). The voltage scaling circuits 402 are used to scale down a higher voltage at a stack-node $V_{CXM}$ to a lower proportional voltage suitable to be coupled to a comparator circuit or the like. As should be clear to one of ordinary skill in the art, the series-connected resistors R1, R2 of the voltage scaling circuits 402 generally would not be identical in value, but instead typically would be sized to generate a desired scaled output for each stack-node $V_{CXM}$. In addition, it should be clear that other circuit configurations may be used for the voltage scaling circuits 402 to accomplish the same result. Further, in some embodiments, the voltage scaling circuits 402 may not be needed, and thus may be omitted.

Figure 4B:
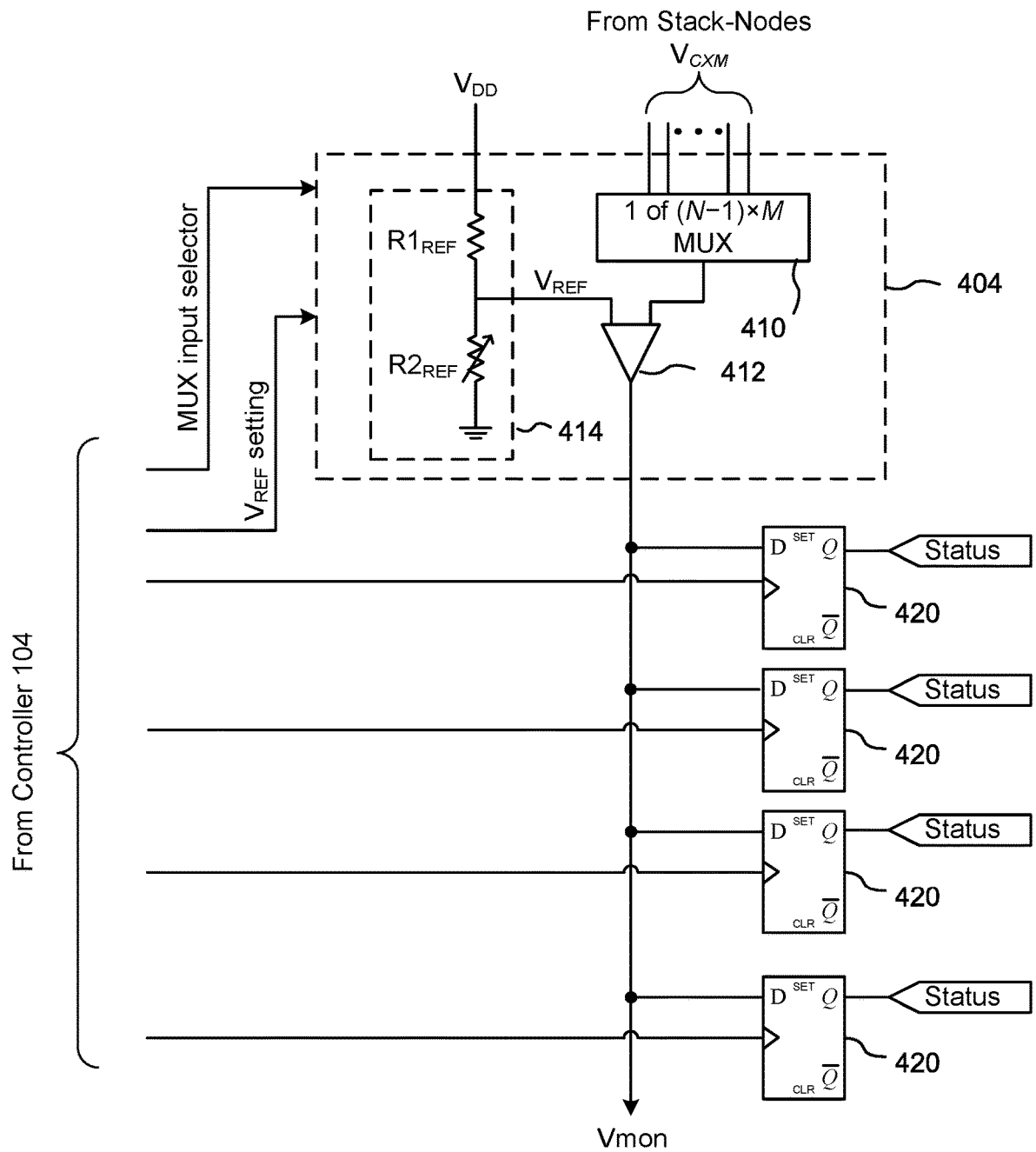
FIG. 4B is a block diagram of the multiplexor and comparator circuit of FIG. 4A in greater detail.

As illustrated, the output of each voltage scaling circuit 402 is coupled to a multiplexor (MUX) and comparator circuit 404. FIG. 4B is a block diagram of the multiplexor and comparator circuit 404 of FIG. 4A in greater detail. A multiplexor 410 is configured to be coupled to (N−1)×M inputs from the stack-node $V_{CXM}$ such that a selected input can be coupled through to a first input of a comparator 412. Selection of the multiplexor 410 input to output to the comparator 412 may be controlled, for example, by the controller 104.

A second input of the comparator 412 is a reference signal $V_{REF}$ from a reference signal source 414. The reference signal source 414 may be, for example, a voltage divider including series-connected resistors $R1_{REF}$, $R2_{REF}$ coupled between a supply voltage $V_{DD}$ and circuit ground, with $V_{REF}$ being generated at a node between the resistors $R1_{REF}$, $R2_{REF}$. In some embodiments, the supply voltage to the reference signal source 414 may instead be derived from another stack-node. As should be clear, other known circuits may be used to implement a reference signal source 414 configured to generate $V_{REF}$, such as a bandgap circuit, a reference current into a resistor, etc. The output Vmon of the comparator 412 is a voltage (or current) that represents the voltage difference between a selected stack-node $V_{CXM}$ and $V_{REF}$.

To support a wide voltage range that may occur at the stack-nodes, it is desirable to make the value of $V_{REF}$ programmable in order to, among other things, keep within the comparator's 412 input common mode range and maximize the signal-to-noise ratio at the comparator's 412 inputs. One way of making the value of $V_{REF}$ programmable is to provide signal-controlled variable resistors for $R1_{REF}$ and/or $R2_{REF}$. For example, in the embodiment illustrated in FIG. 4B, resistor $R2_{REF}$, is shown as a variable resistor. In alternative embodiments, only $R1_{REF}$ may be a variable resistor, or both $R1_{REF}$ and $R2_{REF}$ may be variable resistors. Of course, in some embodiments, neither $R1_{REF}$ nor $R2_{REF}$ may be variable resistors.

An advantage of using variable resistors for one or both of $R1_{REF}$ and $R2_{REF}$ is that the reference signal $V_{REF}$ may be adjusted to correspond to a desired nominal value for the voltage of a stack-node $V_{CXM}$. For example, assume that the desired voltage at stack-node $V_{C11}$ in FIG. 4A is 20V. The corresponding voltage scaling circuit 402 may output a voltage scaled down by a factor of 5 (i.e., to a nominal value of 4V). During measurement of the voltage at stack-node $V_{C11}$, the reference signal $V_{REF}$ may be adjusted to have a value of 4V. Any deviation of the scaled voltage at stack-node $V_{C11}$ from 4V will result in the Vmon output of the comparator 412 being either a logic low or a logic high. Now assume that the desired voltage at stack-node $V_{C21}$ in FIG. 4A is 15V. The corresponding voltage scaling circuit 402 may output a voltage scaled down by a factor of 4 (i.e., to a nominal value of 3.75V rather than 4V). By adjusting one or both of resistors $R1_{REF}$ and $R2_{REF}$, $V_{REF}$ can be adjusted to have the value of 3.75V. Accordingly, the same comparator 412 and reference signal source 414 can be used for both stack-nodes, $V_{C11}$ and $V_{C21}$.

Other circuits may be used to provide a variable $V_{REF}$ input to the comparator 412, in known fashion, including making $V_{DD}$ an adjustable voltage across $R1_{REF}$ and $R2_{REF}$, or replacing $R1_{REF}$ with an adjustable current source, or generating $V_{REF}$ from an adjustable reference signal source 414, so that $V_{REF}$ can be re-programmed after multiplexing to (selecting) a particular selected stack-node $V_{CXM}$.

More generally, the measurement sequence involves: (1) selecting a stack-node $V_{CXM}$ input to the multiplexor 410 as an input to the comparator 412; (2) re-programming (i.e., adjusting) the reference signal $V_{REF}$ to the comparator 412 as may be needed for the selected stack-node $V_{CXM}$ (this step is optional for some embodiments); (3) sampling the voltage corresponding to the selected stack-node $V_{CXM}$ (i.e., comparing the voltage—or a voltage representative of such voltage, such as a scaled voltage—from the selected stack-node $V_{CXM}$ to $V_{REF}$); (4) outputting a signal indicative of the sampling/comparison; and (5) repeating the sequence for at least one other (usually next) stack-node $V_{CXM}$. Accordingly, the comparator 412 is shared by multiple stack-nodes $V_{CXM}$.

In some cases, such as when a switch associated with a stack-node $V_{CXM}$ is on the voltage input ($V_{IN}$) "upper" side of a charge pump 400 (e.g., switch S11 in FIG. 4A with respect to stack-node $V_{C11}$) and is open rather than closed, an adjacent switch (e.g., switch S21 in FIG. 4A) may be simultaneously closed. In such cases, the "upper" stack-node (e.g., $V_{C11}$) would be temporarily at the same voltage as the next "lower" stack-node (e.g., $V_{C21}$), and consequently only one of the stack-nodes needs to be sampled in that switch state.

As should be apparent from FIG. 4A, the multiplexor 410 allows the single comparator 412 to be shared down the N−1 stack-nodes of each charge pump leg and across the M charge pump legs such that the voltage at all stack-nodes $V_{CXM}$ is selected and measured to generate a corresponding Vmon signal. As a consequence, only one multiplexor and comparator circuit 404 is required for all stack-nodes $V_{CXM}$, thus saving considerable IC area.

Second Embodiment

The first embodiment described above results in a very area-efficient measurement circuit. However, sharing one multiplexor and comparator circuit 404 among all stack-nodes $V_{CXM}$ may not result in stack-node voltage measurements that are timely enough to meet desired specifications for some charge pump implementations, particularly during operational charge pump switching. However, the single multiplexor and comparator circuit 404 described above may still be useful before or after operational charge pump switching, during startup or shutdown.

Figure 5:
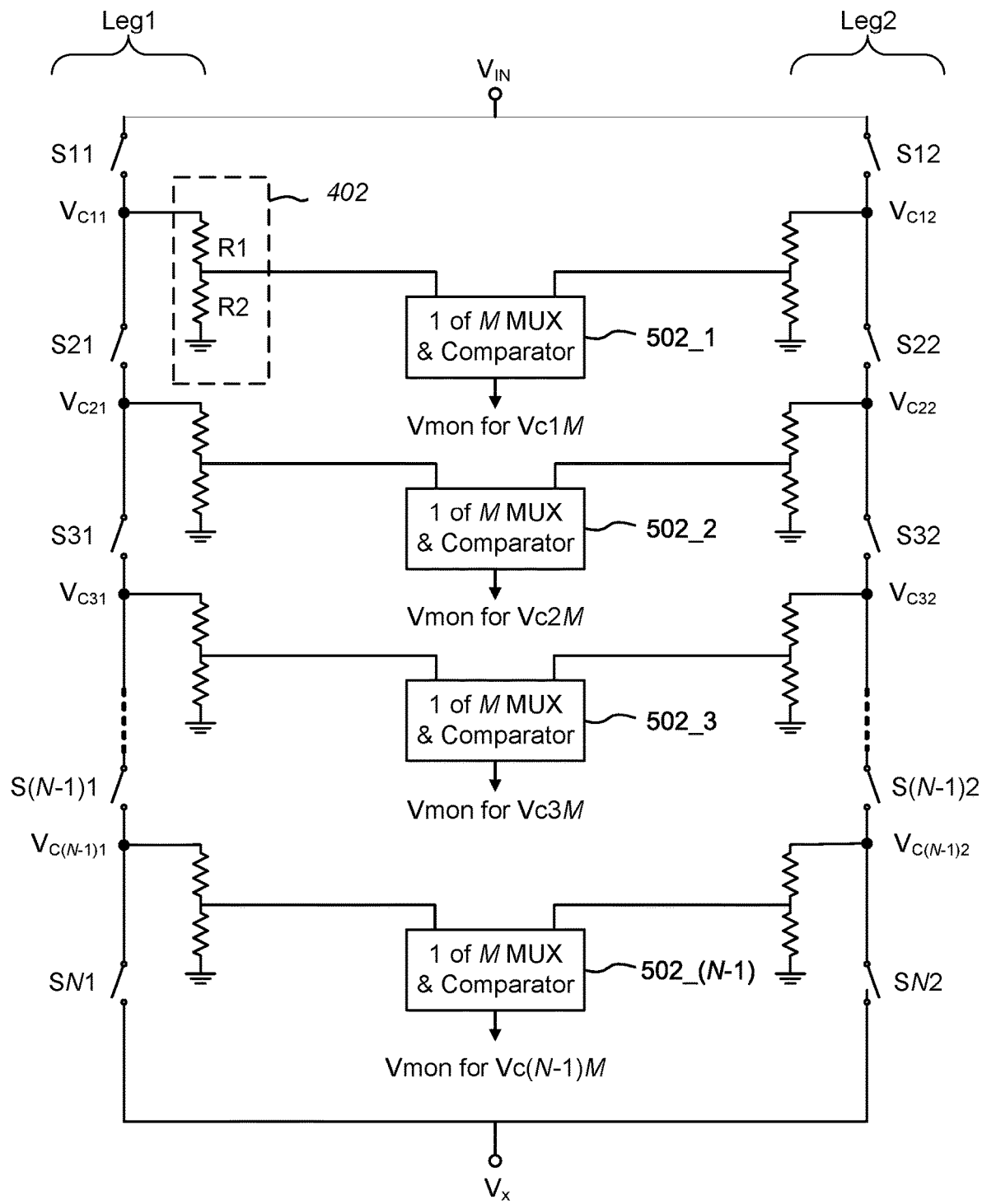
FIG. 5 is a schematic diagram of a multi-phase charge pump having a second measurement circuit architecture.

FIG. 5 is a schematic diagram of a multi-phase charge pump 500 having a second measurement circuit architecture. The architecture of the charge pump legs Leg1, Leg2 is the same as in FIG. 4A. However, rather than sharing one multiplexor and comparator circuit 404 among all stack-nodes $V_{CXM}$, one multiplexor and comparator circuit 502_X is shared among the corresponding stack-nodes $V_{CXM}$ of all M legs for a particular value of "X". That is, for N−1 stack-nodes per leg, there are N−1 corresponding multiplexor and comparator circuits 502_X, and each multiplexor and comparator circuit 502_X is shared across all charge pump legs M at the same stack-node level.

For example, multiplexor and comparator circuit 502_1 is shared by stack-nodes $V_{C11}$ and $V_{C12}$, while multiplexor and comparator circuit 502_(N−1) is shared by stack-nodes $V_{C(N-1)1}$ and $V_{C(N-1)2}$. Accordingly, the number of multiplexor and comparator circuits 502_X does not increase as additional charge pump legs are added, and is a function only of the number of charge pump stages (N−1) per charge pump leg. Thus, the total number of multiplexor and comparator circuits 502_X needed in a charge pump having M legs is N−1.

The multiplexor and comparator circuits 502_X may be implemented as variants of the multiplexor and comparator circuit 404 of FIG. 4B, the only difference being that the multiplexor 410 may have fewer inputs—only M inputs are needed—and thus require less IC area. Again, selection of the multiplexor 410 input to output may be controlled, for example, by the controller 104. The measurement sequence may be the same as described above for the embodiment of FIG. 4A.

The measurement circuit architecture shown in FIG. 5 is faster than the measurement circuit architecture of FIG. 4A since N−1 multiplexor and comparator circuits 502_X are shared among fewer stack-nodes. An added benefit of the measurement circuit architecture shown in FIG. 5 is that the nominal voltage at each stack-node "level" of each charge pump leg (e.g., $V_{C11}$, $V_{C12}$) generally should be the same, and thus dynamic adjustment of $V_{REF}$ may not be required (although it would still be useful for one or both of $R1_{REF}$ and/or $R2_{REF}$ to be adjustable, so that the same circuit may be used for all multiplexor and comparator circuits 502_X with $V_{REF}$ for each circuit being adjusted as needed for a particular stack-node level).

In a variant embodiment of the measurement circuit architecture of FIG. 5, the number of multiplexor and comparator circuits 502_X may be limited to a subset of charge pump legs for faster measurement (not shown). For example, in a charge pump having four charge pump legs, each multiplexor and comparator circuits 502_X may be coupled to the same stack-node level of only 2 charge pump legs. While such a configuration would increase the number of multiplexor and comparator circuits 502_X, the resulting circuit would provide for fast measurement of stack-node voltages while still consuming less IC area than a conventional design that dedicates a measurement circuit for each stack-node $V_{CXM}$. In yet another embodiment, each multiplexor and comparator circuits 502_X could be further multiplexed between different pairs of charge pump legs in a pre-determined manner (e.g., in a round-robin manner).

Third Embodiment

Figure 6:
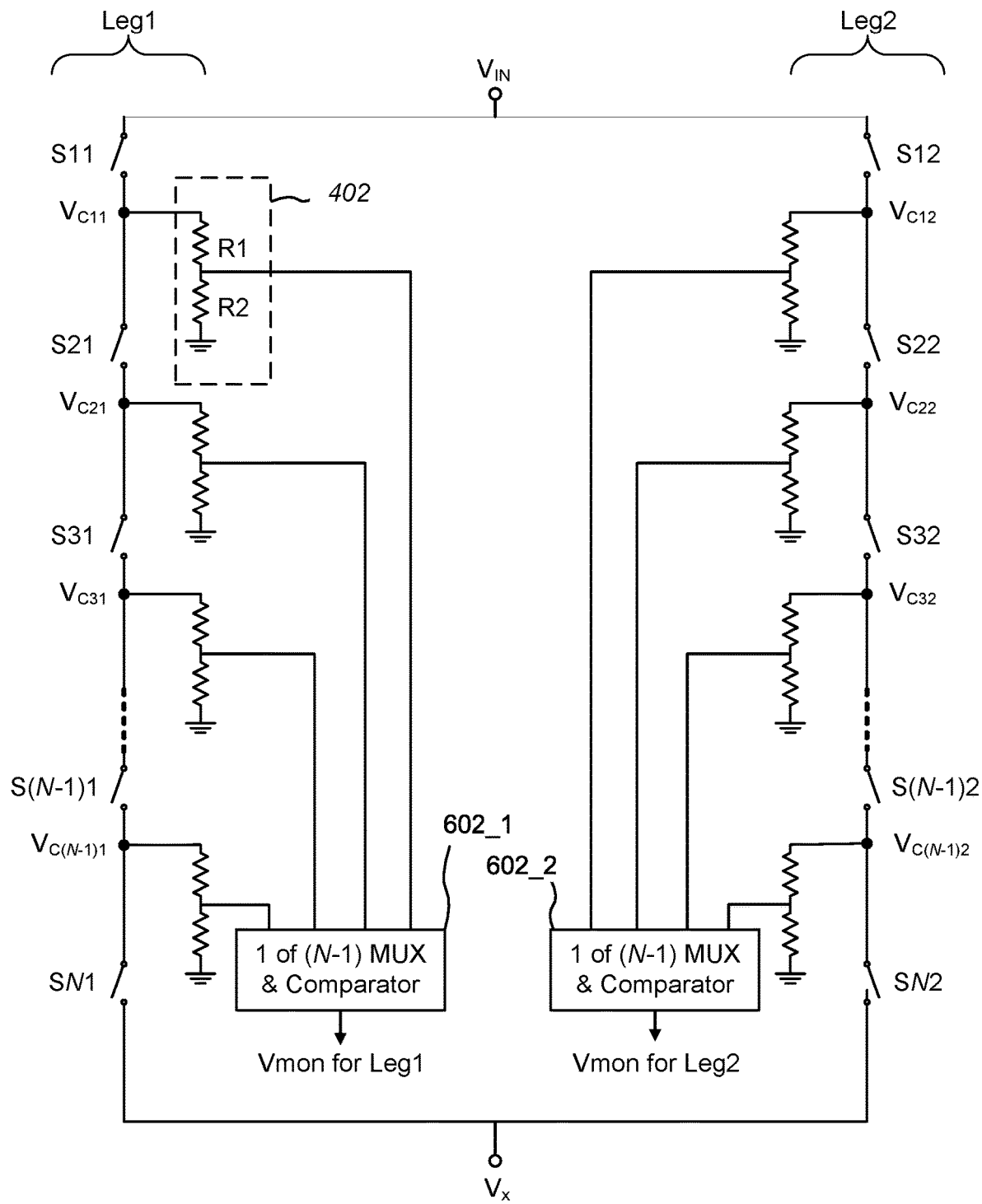
FIG. 6 is a schematic diagram of a multi-phase charge pump having a third measurement circuit architecture.

FIG. 6 is a schematic diagram of a multi-phase charge pump 600 having a third measurement circuit architecture. The architecture of the charge pump legs Leg1, Leg2 is the same as in FIG. 4A and FIG. 5. However, rather than sharing one multiplexor and comparator circuit 404 among all stack-nodes $V_{CXM}$, or sharing N–1 multiplexor and comparator circuits 502_X among corresponding stack-node levels of all M legs, each charge pump leg has a corresponding dedicated multiplexor and comparator circuit 602_m, where m ranges from 1 to M. Thus, for example, a multiplexor and comparator circuit 602_1 is coupled to the stack-nodes $V_{CX1}$ of charge pump Leg1, and a multiplexor and comparator circuit 602_2 is coupled to the stack-nodes $V_{CX2}$ of charge pump Leg2. Accordingly, the number of multiplexor and comparator circuits 602_m does not increase as additional charge pump stages are added per charge pump leg, and the total number of multiplexor and comparator circuits 602_m needed in a charge pump having M legs is M.

The multiplexor and comparator circuits 602_m may be implemented as variants of the multiplexor and comparator circuit 404 of FIG. 4B, the only difference being that the multiplexor 410 may have fewer inputs—only N–1 inputs are needed—and thus require less IC area. Again, selection of the multiplexor 410 input to output may be controlled, for example, by the controller 104. The measurement sequence may be the same as described above for the embodiment of FIG. 4A.

The measurement circuit architecture shown in FIG. 6 is also faster than the measurement circuit architecture of FIG. 4A since M multiplexor and comparator circuits 602_m are shared among fewer stack-nodes $V_{CXM}$.

In a variant embodiment of the measurement circuit architecture of FIG. 6, more than one multiplexor and comparator circuits 602_m may be used per charge pump leg for faster measurement (not shown). For example, in a charge pump having 4 stages per charge pump leg m, stack-nodes $V_{C1m}$ and $V_{C2m}$ may be coupled to an "upper" multiplexor and comparator circuit, and stack-nodes $V_{C3m}$ and $V_{C4m}$ may be coupled to a "lower" multiplexor and comparator circuit. The resulting circuit would provide for fast measurement of stack-node voltages while still consuming less IC area than a conventional design that dedicates a measurement circuit for each stack-node $V_{CXM}$.

Fourth Embodiment

Figure 7:
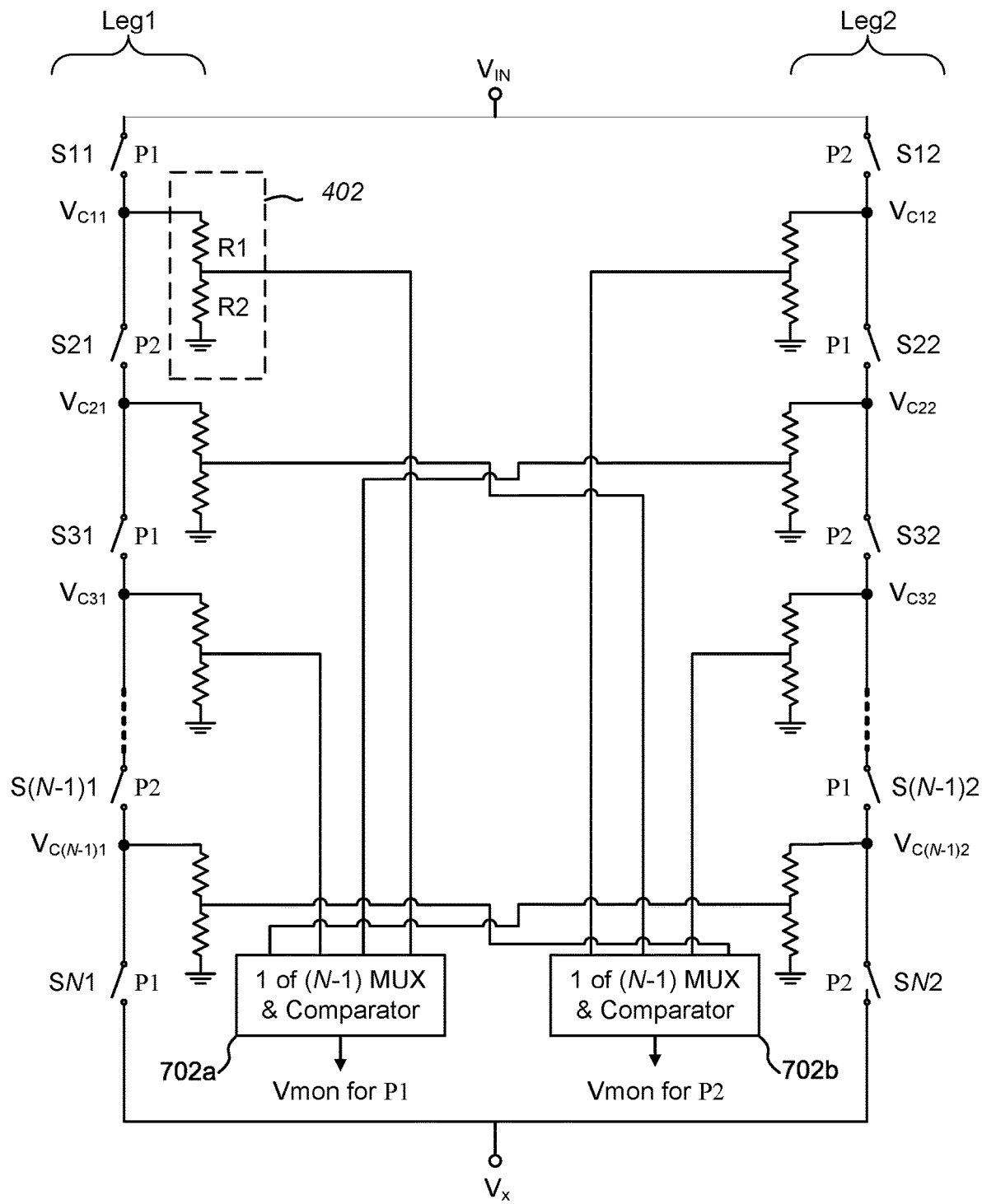
FIG. 7 is a schematic diagram of a multi-phase charge pump having a fourth measurement circuit architecture.

FIG. 7 is a schematic diagram of a multi-phase charge pump 700 having a fourth measurement circuit architecture. The architecture of the charge pump legs Leg1, Leg2 is the same as in FIG. 4A and FIG. 5. However, as described above, the odd switches and even switches in each charge pump leg Leg1, Leg2 are clocked by non-overlapping clock waveforms P1 and P2. For example, as indicated in FIG. 7, in Leg1, odd switches S11, S31, and SN1 (where "N" is odd) are clocked by waveform P1, while even switches S21 and S(N–1)1 (again, where "N" is odd) are clocked by waveform P2. Conversely, in Leg2, odd switches S12, S32, and SN2 are clocked by waveform P2, while even switches S22 and S(N–1)2 are clocked by waveform P1. Switches labeled P1 are closed when clock waveform P1 is a logic high and clock waveform P2 is a logic low, and are open when clock waveform P1 is a logic low and clock waveform P2 is a logic high. Similarly, switches labeled P2 are closed when clock waveform P2 is a logic high and clock waveform P1 is a logic low, and are open when clock waveform P2 is a logic low and clock waveform P1 is a logic high.

With this pattern of clock waveforms P1 and P2 in mind, in the embodiment shown in FIG. 7, the stack-nodes $V_{CXM}$ associated with the switches controlled by clock waveform P1 are coupled to a corresponding multiplexor and comparator circuit 702a, while the stack-nodes $V_{CXM}$ associated with the switches controlled by clock waveform P2 are coupled to a corresponding multiplexor and comparator circuit 702b. Accordingly, in the illustrated embodiment, the number of multiplexor and comparator circuits 702x does not increase as additional charge pump stages are added per charge pump leg. In general, the total number of multiplexor and comparator circuits 702x needed in a charge pump having P waveform phases is P. Thus, a charge pump having only clock waveforms P1 and P2 would need only 2 multiplexor and comparator circuits 702a, 702b. In variant embodiments where more stages are added to existing legs but these stages are controlled by different phases, or where more legs are added controlled by different phases, the number of multiplexor and comparator circuits may increase as a function of the number of phases.

Note that in some embodiments, more switching states are possible (e.g., a switch state in which all switches are open, such as during a deadtime), but are not shown for clarity since such states may not affect the number of multiplexor and comparator circuits 702x. Nevertheless, the multiplexor and comparator circuits 702x may also be selectively engaged during these additional switching states using a similar measurement sequence as previously described for the embodiment of FIG. 4A.

The multiplexor and comparator circuits 702x may be implemented as variants of the multiplexor and comparator circuit 404 of FIG. 4B, the only difference being that the multiplexor 410 may have fewer inputs and thus require less IC area. Again, selection of the multiplexor 410 input to output may be controlled, for example, by the controller 104. The measurement sequence may be the same as described above for the embodiment of FIG. 4A.

The measurement circuit architecture shown in FIG. 7 is faster than the measurement circuit architecture of FIG. 4A since the P number of multiplexor and comparator circuits 702x are shared among fewer stack-nodes.

In a variant embodiment of the measurement circuit architecture of FIG. 7, more than one multiplexor and comparator circuits 702x may be used per waveform phase P for faster measurement (not shown). The resulting circuit would provide for fast measurement of stack-node voltages while still consuming less IC area than a conventional design that dedicates a measurement circuit for each stack-node $V_{CXM}$.

A particularly useful aspect of the measurement circuit architecture of FIG. 7 is that it may be desirable to connect the comparator 412 through the multiplexor 410 to a particular stack-node $V_{CXM}$ in one switching state for one monitoring purpose, and in another switching state for a different monitoring purpose. For example, it may be desirable to connect the comparator 412 through the multiplexor 410 to a stack-node (e.g., $V_{C11}$) when the corresponding switch (e.g., S11) is closed in order to monitor current or FET resistance. Conversely, it may be desirable to connect the comparator 412 through the multiplexor 410 to the same stack-node when the corresponding switch is open in order to monitor over-voltage or capacitor voltage imbalance.

Fifth Embodiment

Figure 8:
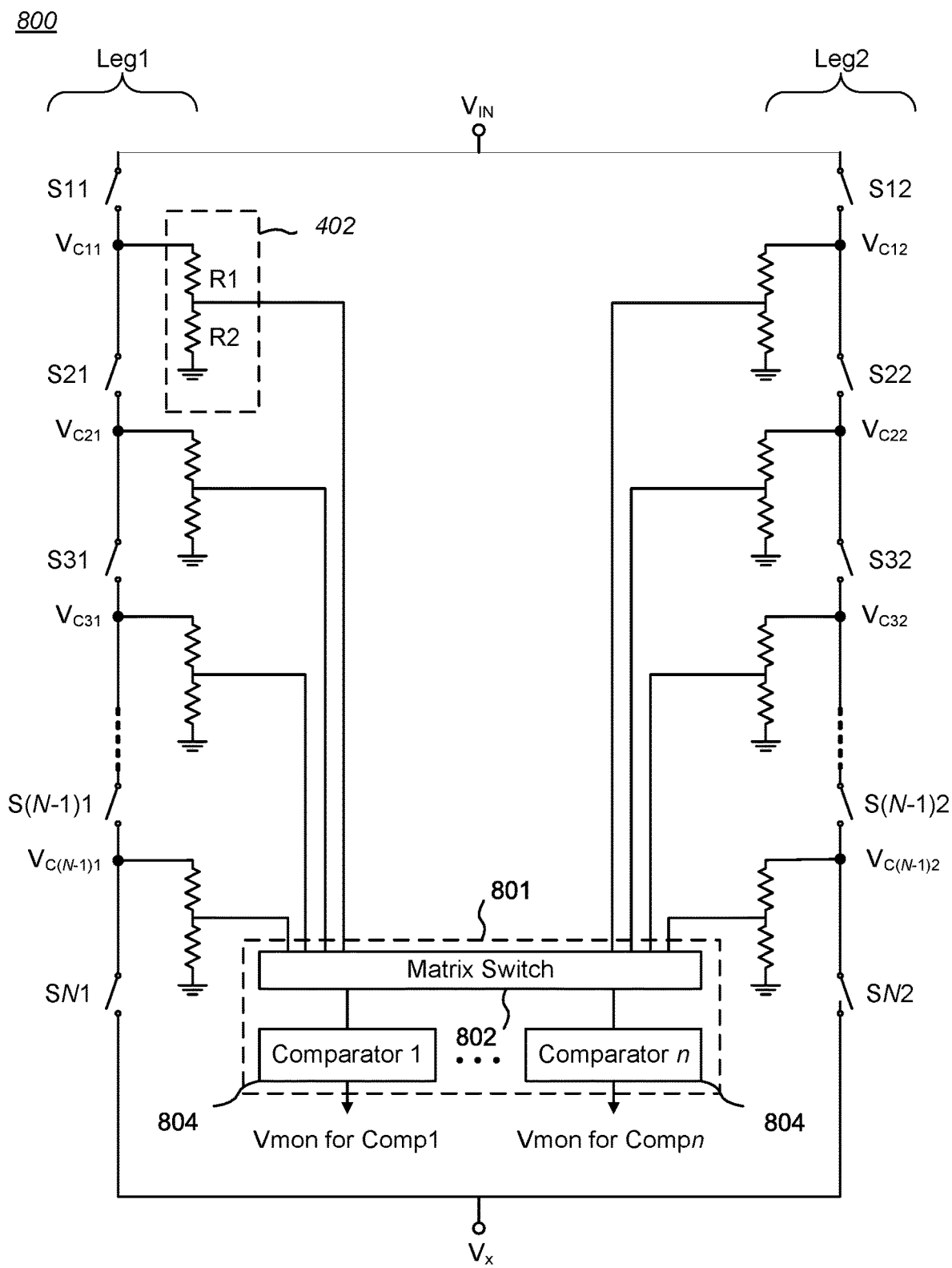
FIG. 8 is a schematic diagram of a multi-phase charge pump having a fifth measurement circuit architecture.

FIG. 8 is a schematic diagram of a multi-phase charge pump 800 having a fifth measurement circuit architecture. The architecture of the charge pump legs Leg1, Leg2 is the same as in FIG. 4A and FIG. 5. However, each stack-node $V_{CXM}$ is coupled to a multiplexor and comparator circuit 801 that includes an XY matrix switch 802 configured to concurrently switch any input X to any one of one or more outputs Y; accordingly, the XY matrix switch 802 operates as a fully programmable X-to-Y multiplexor. For example, stack-node $V_{C11}$ may be coupled to a first output while stack-node $V_{C12}$ is coupled to a second output.

Each output is coupled to a respective one of n comparators 804, where $M \times (N-1) \geq n \geq 1$, for comparison internally to a respective selected reference signal $V_{REF}$. The comparators 804 may be, for example, similar to the multiplexor and comparator circuit 404 of FIG. 4B, but without the multiplexor 410 (which is effectively replaced by the XY matrix switch 802).

An advantage of the measurement circuit architecture of FIG. 8 is that the number n of the comparators 804 can be sized as needed to balance measurement speed and IC area. It should be apparent to one of ordinary skill in the art that the XY matrix switch 802 may be programmatically controlled (e.g., by the controller 104) to provide the functionality of any of the measurement circuit architectures of FIGS. 4A, 5, 6, and 7 if a suitable number of comparators 804 are coupled to the XY matrix switch 802. Thus, for example, if only one comparator 804 is coupled to the XY matrix switch 802, then the measurement circuit architecture of FIG. 8 can provide the functionality of the measurement circuit architecture of FIG. 4A. Similarly, for a charge pump having only 2 charge pump legs or only 2 waveform phases, then by coupling 2 comparators 804 to the XY matrix switch 802, the measurement circuit architecture of FIG. 8 can provide the functionality of the measurement circuit architectures of FIG. 6 or FIG. 7, respectively. As another example, by coupling 4 comparators 804 to the XY matrix switch 802, then the measurement circuit architecture of FIG. 8 can provide the functionality of the measurement circuit architecture of FIG. 5 for a divide-by-5 charge pump 500.

Switched Voltage Scaling Circuit

Figure 9:
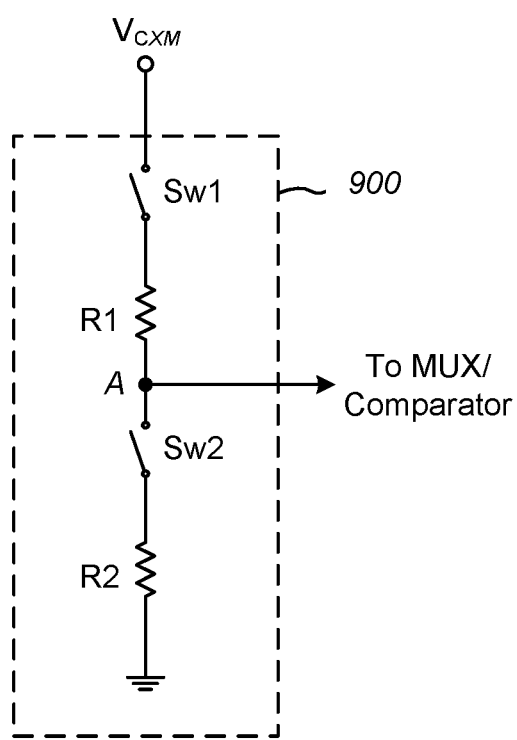
FIG. 9 is a schematic diagram of an isolatable voltage scaling circuit.

Some embodiments of the inventive measurement circuit architectures described above may benefit by being able to isolate idle voltage scaling circuits 402 from their associated multiplexor and comparator circuit 404, 502_X, 602_m, 702x. Other embodiments may benefit by being able to isolate voltage scaling circuits 402 from each stack-node $V_{CXM}$. For example, FIG. 9 is a schematic diagram of an isolatable voltage scaling circuit 900. The isolatable voltage scaling circuit 900 includes a voltage divider comprising resistors R1, R2 and a "top" switch Sw1 and/or a "middle" switch Sw2, coupled in series as shown between an input from a stack-node $V_{CXM}$ and circuit ground. More specifically, in some embodiments, if present, switch Sw1 is coupled between resistor R1 and the input from a stack-node $V_{CXM}$, and, if present, switch Sw2 is coupled between resistor R1 and resistor R2. In alternative embodiments, the order of the switch Sw1 and resistor R1 may be reversed, and/or the order of the switch Sw2 and resistor R2 may be reversed. The switches Sw1, Sw2 may be, for example, N-type or P-type MOSFETs. Selection of open or closed switch states for switches Sw1, Sw2 may be set by the controller 104.

If only switch Sw1 is included, then when open, the node A that connects the isolatable voltage scaling circuit 900 to an associated multiplexor and comparator circuit is discharged to circuit ground, thus isolating the associated multiplexor and comparator circuit from any voltage on the associated stack-node $V_{CXM}$.

If only switch Sw2 is included, then when open, the node A that connects the isolatable voltage scaling circuit 900 to an associated multiplexor and comparator circuit charges to the voltage on the associated stack-node $V_{CXM}$. This may be beneficial, for example, if the associated multiplexor and comparator circuit has different ground potential than the isolatable voltage scaling circuit 900.

If both switch Sw1 and switch Sw2 are included (again, in either series order with respect to their associated resistors R1, R2), then either of the above modes of operation may be selected. When either switch Sw1 or Sw2 are open, the current path from a stack-node $V_{CXM}$ to ground through resistors R1, R2 is disconnected, thereby preventing leakage that might discharge the voltage at that stack-node $V_{CXM}$.

In a variant embodiment of the isolatable voltage scaling circuit 900, switch Sw1 may comprise an array of multiple switches, each connecting the voltage divider formed by resistors R1, R2 to a different stack-node $V_{CXM}$. This approach may yield further die area savings by significantly reducing the number of voltage scaling circuits 402. For example, in the embodiment of FIG. 6, one isolatable voltage scaling circuit 900 can be used per charge pump leg if switch Sw1 comprises (N−1) switches $Sw1_{XM}$, each connecting resistor R1 to corresponding stack-nodes $V_{C1M}$, $V_{C2M}$, $V_{C3M}$, ... $V_{C(N-1)M}$. The total number of isolatable voltage scaling circuits 900 in this case is equal to the number of charge pump legs M. As another example, in the embodiment of FIG. 5, one isolatable voltage scaling circuit 900 can be used per stack-node level if switch Sw1 comprises M switches $Sw1_{XM}$, each connecting resistor R1 to corresponding stack-nodes $V_{CXM}$. The total number of isolatable voltage scaling circuits 900 in this case is equal to the number of charge pump stages (N−1).

In some embodiments, the isolatable voltage scaling circuit 900 for a selected stack-node $V_{CXM}$ may be used as the supply voltage to a $V_{REF}$ reference signal source, such as the example reference signal source 414 shown in of FIG. 4B.

Select-Sample-and-Hold Embodiments

In some embodiments, it may be useful to capture the state of Vmon in one or more latch circuits so that the status of multiple stack-nodes $V_{CXM}$ is available for use in further control processing (e.g., by the controller 104). For example, referring to FIG. 4B, the controller 104 may select a particular stack-node $V_{CXM}$ input to output from the multiplexor 410 to the comparator 412. Concurrently, the controller 104 may set the value of $V_{REF}$ to correspond to a desired reference signal for the selected stack-node $V_{CXM}$, and then clock one of a set of latches (e.g., D flip-flops 420) to capture the state of Vmon generated by the comparison of the voltage for the selected stack-node $V_{CXM}$ relative to $V_{REF}$. Accordingly, the multiplexor and comparator circuit 404 with added latch circuits functions as a select-sample-and-hold circuit. The control signals from the controller 104 may be direct control lines, or may be encoded (e.g., as a binary value), or may be a combination of direct control lines and encoded control lines. In the case of encoded control lines, a decoder may be used to convert the encoded control signals to direct control lines, in known fashion.

It may be noted that the measurement circuit architectures above allow a particular stack-node $V_{CXM}$ to be compared against more than one value for $V_{REF}$. Thus, for example, stack-node $V_{C11}$ can be compared to a relatively low value for $V_{REF}$ and then to a relatively high value for $V_{REF}$ (or vice versa) to verify that the voltage at stack-node $V_{C11}$ falls within a desired range, such as ±20% of a desired value. A multiplexor and comparator circuit 404 with added latch circuitry facilitates such comparisons.

As should be clear, embodiments of any of the above-described measurement circuit architectures may be used to measure voltages at other nodes, such as $V_{IN}$, $V_X$, or $V_{OUT}$, by coupling those nodes to an input of the comparator 412. Furthermore, these embodiments may also be used to measure or compare voltages between a pair of stack-nodes, particularly if reference signal source 414 (see FIG. 4B) is replaced with a voltage scaling circuit 402 or even an isolated voltage scaling circuit 900 that connects to at least one other stack-node. Referring to the isolated voltage scaling circuit 900 of FIG. 9, the node A at the mid-point between resistors R1 and R2 would connect to the second input of comparator 412 instead of reference signal $V_{REF}$. A variant embodiment involving the multiplexor and comparator circuit 404 consists of using two multiplexors 410, each connecting to the first and second inputs of comparator 412 and having inputs coupled to various stack-nodes $V_{CXM}$ so that a comparison can be made between any two of the coupled stack-nodes. This way, multiple pairs of stack-node voltages can be measured and compared in an area-efficient yet flexible manner.

Built-in Self-Test

In some cases, such as after a charge pump IC is packaged in a circuit module, the stack-nodes $V_{CXM}$ are not accessible when the IC is assembled in a final product (e.g., soldered to a circuit board within a cellular phone handset). However, by using one of the measurement circuit architectures described above, the stack-nodes $V_{CXM}$ can be used to verify matching among pump capacitors (e.g., C1-C4 in FIG. 2) after assembly. When all pump capacitors match, the pump capacitors should charge at the same rate. Conversely, when some pump capacitors are not matched, they will not charge at the same rate. Alternatively, one of the measurement circuit architectures described above can also be used to verify the value of the individual pump capacitors by determining the charge or discharge duration.

As background, when applying a fixed current i to a capacitor C, the voltage V across the capacitor should increase according to EQ. 1:

$$\frac{dV}{dt} = \frac{i}{C} \qquad \text{EQ. 1}$$

During post-packaging testing, the voltage at each stack-node $V_{CXM}$ corresponding to a capacitor $C_{XM}$ can be monitored using an embodiment of one of the inventive measurement circuit architectures described above. The voltage of a monitored stack-node $V_{CXM}$ would be expected to reach a desired corresponding $V_{REF}$ value at time $T_{CXM}$, which may be set as a sampling time for the measurement circuit. However, if the capacitance of the corresponding capacitor $C_{XM}$ is significantly below or above a target value (e.g., more than about 20% from a target value), the voltage measured at the corresponding stack-node $V_{CXM}$ at time $T_{CXM}$ will be too low or too high, indicating an out-of-specification capacitor.

Thus, by using a measurement circuit architecture as described above, the stack-nodes $V_{CXM}$ can be monitored for "out-of-bound" conditions.

Similarly, the voltage difference between adjacent stack-nodes (e.g., $V_{C1M}$ versus $V_{C2M}$) may be measured during a switching phase when the switch connecting the adjacent stack-nodes is closed, and at a given current through the switch. Such information can then be used to determine the ON-resistance of the switch, as well as the magnitude of the current through the switch.

As an example, for a 4-stage embodiment of the charge pump shown in FIG. 7, there are a total of 8 stack-nodes $V_{CXM}$ (4 per charge pump leg), which should have node voltages (excluding IR drops) during each switch event for P1 and P2 as set forth in TABLE 1:

TABLE 1

| Expected Voltage | Phase P1 | Phase P2 |
|---|---|---|
| 5Vx | $V_{C11}$ | $V_{C12}$ |
| 4Vx | $V_{C12}, V_{C22}$ | $V_{C11}, V_{C21}$ |
| 3Vx | $V_{C21}, V_{C31}$ | $V_{C22}, V_{C32}$ |
| 2Vx | $V_{C32}, V_{C42}$ | $V_{C31}, V_{C41}$ |
| 1Vx | $V_{C41}$ | $V_{C42}$ |

With this knowledge, stack-nodes can be selected for monitoring during each phase P1, P2 of the charge pump cycle. As an example, nodes to monitor for over-current protection may include $V_{IN}$, $V_X$, $V_{C11}$, and $V_{C41}$ when P1 is "ON" and P2 is "OFF", and $V_{IN}$, $V_X$, $V_{C12}$, and $V_{42}$ when P2 is "ON" and P1 is "OFF".

With a selected value for a tolerance α (e.g., 20%), during each phase P1, P2 of the charge pump cycle, the selected nodes are sampled and compared against their expected $V_{REF}$ voltage ±α. If any node satisfies an "out-of-bound" condition (i.e., is outside of the expected range), an error signal is asserted, indicating an out-of-specification capacitor, or an out-of-specification switch on-resistance, or even a possible fault condition.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

As discussed above, the current invention encompasses power converter circuits, including DC-DC converter circuits, that conserve IC area by utilizing more area-efficient alternatives for measurement circuitry. Reducing IC area while retaining comparable or better functionality also reduces cost, or alternatively allows additional circuitry—and thus functionality—to be included on the same IC without increasing overall IC size or cost.

Methods

Figure 10:
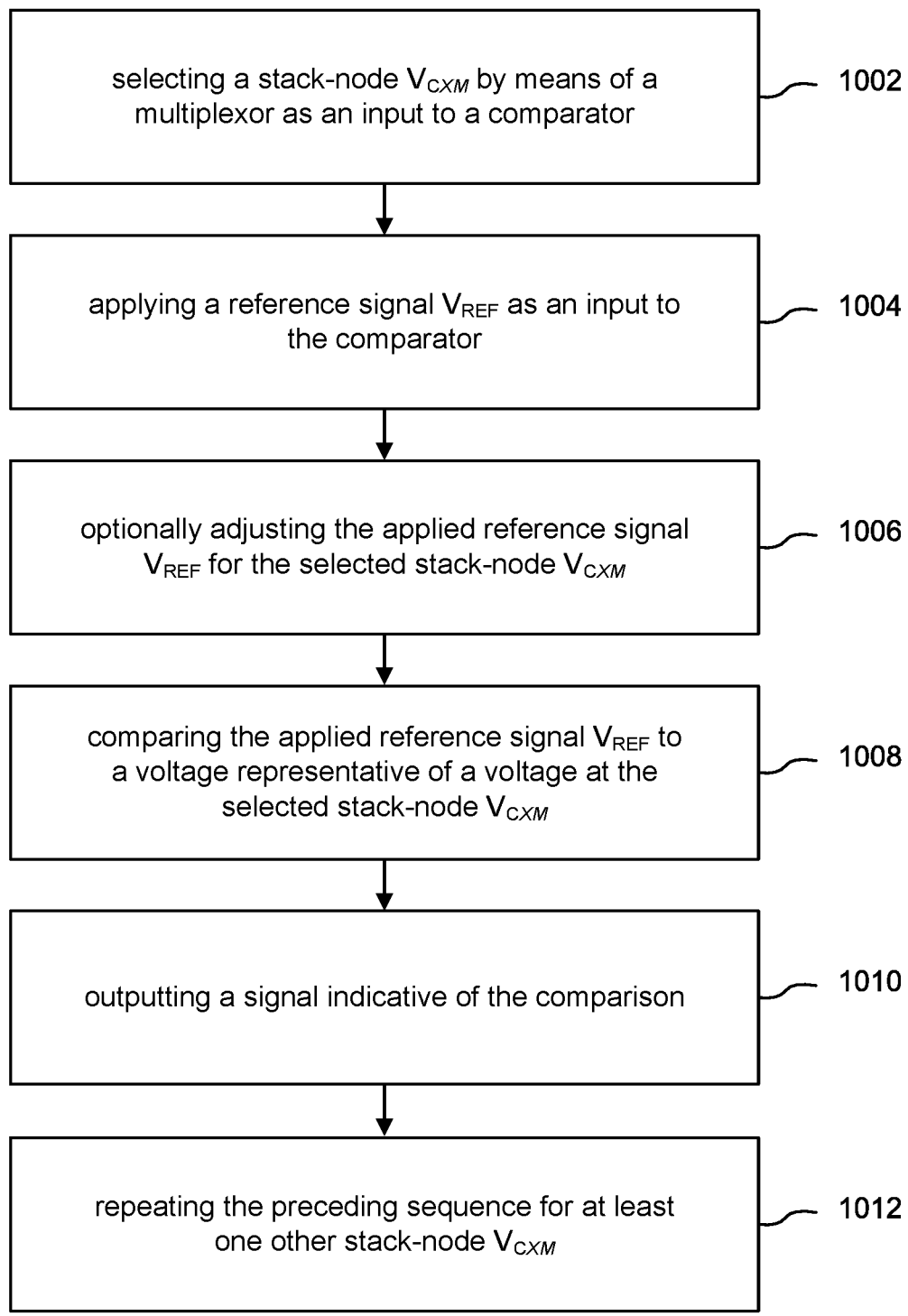
FIG. 10 is a process flow chart showing a method for measuring voltages at stack-nodes $V_{CXM}$ in a charge pump.

Another aspect of the invention includes methods for measuring voltages at stack-nodes in a charge pump. For example, FIG. 10 is a process flow chart 1000 showing a method for measuring voltages at stack-nodes $V_{CXM}$ in a charge pump. The method includes: selecting a stack-node $V_{CXM}$ by means of a multiplexor as an input to a comparator [Block 1002]; applying a reference signal $V_{REF}$ as an input to the comparator [Block 1004]; optionally adjusting the applied reference signal $V_{REF}$ for the selected stack-node $V_{CXM}$ [Block 1006]; comparing the applied reference signal $V_{REF}$ to a voltage representative of a voltage at the selected stack-node $V_{CXM}$ [Block 1008]; outputting a signal indicative of the comparison [Block 1010]; and repeating the preceding sequence for at least one other stack-node $V_{CXM}$ [Block 1012].

Figure 11:
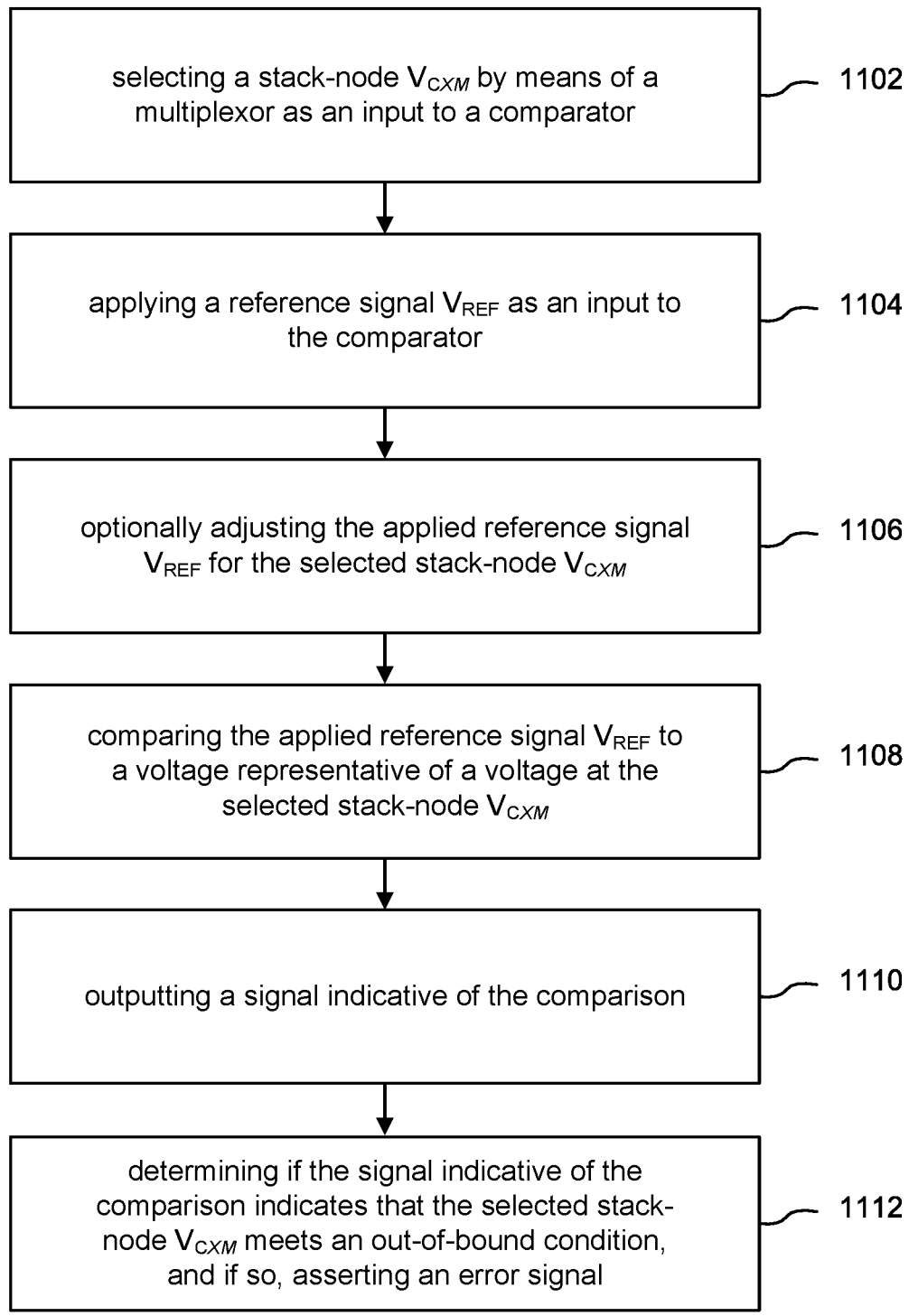
FIG. 11 is a process flow chart showing a method for testing pump capacitors in a charge pump by measuring voltages at stack-nodes $V_{CXM}$ in the charge pump.

Another aspect of the invention includes methods for testing pump capacitors in a charge pump. For example, FIG. 11 is a process flow chart 1100 showing a method for testing pump capacitors in a charge pump by measuring voltages at stack-nodes $V_{CXM}$ in the charge pump. The method includes: selecting a stack-node $V_{CXM}$ by means of a multiplexor as an input to a comparator [Block 1102]; applying a reference signal $V_{REF}$ as an input to the comparator [Block 1104]; optionally adjusting the applied reference signal $V_{REF}$ for the selected stack-node $V_{CXM}$ [Block 1106]; comparing the applied reference signal $V_{REF}$ to a voltage representative of a voltage at the selected stack-node $V_{CXM}$ [Block 1108]; outputting a signal indicative of the comparison [Block 1110]; and determining if the signal indicative of the comparison indicates that the selected stack-node $V_{CXM}$ meets an out-of-bound condition, and if so, asserting an error signal [Block 1112]. The out-of-bound condition may be one or both of the out-of-bound conditions described above.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased or assembled in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A power converter circuit including:
   (a) at least one set of N series switches where N≥2, each set configured as one of M charge pump legs where M≥1, wherein each pair of adjacent series switches in each charge pump leg defines a stack-node $V_{CXM}$ located between the adjacent series switches, where N−1≥X>1;
   (b) at least one voltage scaling circuit, each coupled to a corresponding stack-node $V_{CXM}$ and configured to output a voltage proportional to a voltage at the corresponding stack-node $V_{CXM}$;
   (c) at least one multiplexor, each having (1) at least one input, each input coupled to the output of a corresponding one of the at least one voltage scaling circuit, and (2) at least one output; and
   (d) at least one comparator circuit, each having a first input coupled to a corresponding output of one of the at least one multiplexor, and a second input coupled to a reference signal, and configured to output a signal indicative of a difference between a selected input to the multiplexor and the reference signal;
   wherein the number of comparator circuits is less than (N−1)×M.

2. The invention of claim 1, wherein at least one voltage scaling circuit includes a voltage divider comprising first and second series-connected resistors coupled between the corresponding stack-node $V_{CXM}$ and circuit ground.

3. The invention of claim 2, wherein the voltage divider includes at least one series switch configured to make the voltage divider selectably isolatable.

4. The invention of claim 1, wherein the reference signal is generated by a voltage divider comprising first and second series-connected resistors coupled between a supply voltage and circuit ground.

5. The invention of claim 4, wherein the reference signal is adjustable in value.

6. The invention of claim 4, wherein the supply voltage is derived from an isolated voltage scaling circuit for a selected stack-node $V_{CXM}$.

7. The invention of claim 1, wherein at least one of the at least one comparator circuit includes latch circuitry coupled to the output of the comparator circuit for capturing a status for multiple stack-nodes $V_{CXM}$.

8. The invention of claim 1, wherein all stack-nodes $V_{CXM}$ are coupled to one multiplexor, and the one multiplexor is coupled to one comparator circuit.

9. The invention of claim 1, wherein one or more stack-nodes $V_{CXM}$ designated by the same X value but different M values are coupled to one respective multiplexor, and the one respective multiplexor is coupled to one corresponding comparator circuit.

10. The invention of claim 1, wherein one or more stack-nodes $V_{CXM}$ designated by the same M value but different X values are coupled to one respective multiplexor, and the one respective multiplexor is coupled to one corresponding comparator circuit.

11. The invention of claim 1, wherein:
   (a) a first subset of stack-nodes $V_{CXM}$ are controlled by a first clock waveform and a second subset of stack-nodes $V_{CXM}$ are controlled by a second clock waveform;
   (b) one or more stack-nodes $V_{CXM}$ in the first subset of stack-nodes $V_{CXM}$ are coupled to one respective first multiplexor, and the one respective first multiplexor is coupled to one corresponding first comparator circuit; and
   (c) one or more stack-nodes $V_{CXM}$ in the second subset of stack-nodes $V_{CXM}$ are coupled to one respective second multiplexor, and the one respective second multiplexor is coupled to one corresponding second comparator circuit.

12. The invention of claim 1, wherein all stack-nodes $V_{CXM}$ are coupled to a multiplexor comprising a matrix switch having a plurality of outputs, and one or more of the plurality of outputs is coupled to a respective one of n comparator circuits, where M×(N−1)>n≥1.

13. A method for measuring voltages in a power converter circuit comprising at least one set of N series switches where N≥2, each set configured as one of M charge pump legs where M≥1, wherein each pair of adjacent series switches in each charge pump leg defines a stack-node $V_{CXM}$ located between the adjacent series switches, where N−1≥X>1, the method including:
   (a) performing a sequence of steps, including:
      (1) selecting done stack-node $V_{CXM}$ by means of a multiplexor as an input to a comparator;
      (2) applying a reference signal $V_{REF}$ as an input to the comparator;
      (4) comparing the applied reference signal $V_{REF}$ to a proportional voltage representative of a voltage at the selected one stack-node $V_{CXM}$;
      (5) outputting a signal indicative of the comparison; and
   (b) repeating the sequence of steps for at least one other stack-node $V_{CXM}$.

14. A method for testing pump capacitors in a charge pump by measuring voltages in a power converter circuit comprising at least one set of N series switches where N≥2, each set configured as one of M charge pump legs where M≥1, wherein each pair of adjacent series switches in each charge pump leg defines an associated stack-node $V_{CXM}$ located between the adjacent series switches, where N−1≥X>1, the method including:
   (a) selecting a stack-node $V_{CXM}$ by means of a multiplexor as an input to a comparator;
   (b) applying a reference signal $V_{REF}$ as an input to the comparator;
   (c) comparing at a selected time the applied reference signal $V_{REF}$ to a proportional voltage representative of a voltage at the selected stack-node $V_{CXM}$;
   (d) outputting a signal indicative of the comparison; and
   (e) determining if the signal indicative of the comparison indicates that the selected stack-node $V_{CXM}$ meets an out-of-bound condition, and if so, asserting an error signal.

15. The method of claim 13, further including adjusting the applied reference signal $V_{REF}$ for the selected stack-node $V_{CXM}$ before comparing the applied reference signal $V_{REF}$ to a voltage representative of a voltage at the selected stack-node $V_{CXM}$.

16. The method of claim 14, further including adjusting the applied reference signal $V_{REF}$ for the selected stack-node $V_{CXM}$ before comparing at a selected time the applied reference signal $V_{REF}$ to a voltage representative of a voltage at the selected stack-node $V_{CXM}$.

* * * * *